(12) United States Patent
Kitagawa

(10) Patent No.: US 6,169,392 B1
(45) Date of Patent: Jan. 2, 2001

(54) DC-DC CONVERTER CIRCUIT

(75) Inventor: Seiya Kitagawa, Yatsushiro (JP)

(73) Assignee: Fujitsu Limited, Kawasaki (JP)

( * ) Notice: Under 35 U.S.C. 154(b), the term of this patent shall be extended for 0 days.

(21) Appl. No.: 09/460,425

(22) Filed: Dec. 14, 1999

(30) Foreign Application Priority Data

Dec. 24, 1998 (JP) .................................................. 10-366501

(51) Int. Cl.$^7$ ...................................................... G05F 1/40
(52) U.S. Cl. .......................................................... 323/282
(58) Field of Search .................................. 323/266, 273, 323/275, 279, 282, 285

(56) References Cited

U.S. PATENT DOCUMENTS

| | | | |
|---|---|---|---|
| 4,816,739 | * 3/1989 | Sakurai et al. | 323/272 |
| 5,122,728 | * 6/1992 | Ashley | 323/282 |
| 5,610,504 | * 3/1997 | Tsugita | 323/283 |

* cited by examiner

*Primary Examiner*—Matthew Nguyen
(74) *Attorney, Agent, or Firm*—Armstrong, Westerman, Hattori, McLeland & Naughton

(57) ABSTRACT

A DC—DC converter circuit for performing DC—DC conversion by switching an input voltage on and off achieves high conversion efficiency while, at the same time, making it possible to supply low voltages. The DC—DC converter circuit includes: a level shift circuit which generates a voltage that is lower than the input voltage by a predetermined voltage; a power supply generating circuit which generates a floating power supply having a magnitude equal to the difference between the input voltage and the output voltage of the level shift circuit; a capacitor which is charged up by the floating power supply generated by the power supply generating circuit; and a driver circuit which supplies the charged voltage of the capacitor as a driving voltage to the main switching device in accordance with the operation control signal. In an alternative configuration, the capacitor is omitted, and the driver circuit is configured to supply the voltage of the floating power supply generated by the power supply generating circuit as the driving voltage to the main switching device.

13 Claims, 16 Drawing Sheets

DC-DC CONVERTER CIRCUIT

BACKGROUND OF THE INVENTION

1. Field of the Invention

The present invention relates to a DC—DC converter circuit for performing DC—DC conversion by switching an input voltage on and off and, more particularly, to a DC—DC converter circuit that achieves high conversion efficiency while, at the same time, making it possible to supply low voltages.

2. Description of the Related Art

Battery-operated apparatuses such as notebook-size personal computers are provided with a DC—DC converter circuit for converting a voltage from an AC adapter, a dry battery, etc. into a voltage needed by the load. To increase the utility of such battery-operated apparatuses, the conversion efficiency of the DC—DC converter circuit must be increased.

In the DC—DC converter circuits used in battery-operated apparatuses such as notebook-sized personal computers, switching regulators for performing PWM (pulse width modulation) are used to achieve as high conversion efficiency as possible.

For switching devices in such DC—DC converters, N-channel MOSFETs are often used. The reason for this is that N-channel MOSFETs have lower ON resistance, are less expensive, and offer a wider selection of products than P-channel MOSFETs.

However, to cause an N-channel MOSFET to turn on, the gate voltage must be made higher than the source voltage, and when switching the power line on and off, a voltage higher than the power line must be applied to the gate of the MOSFET.

To achieve this, the prior art provides a configuration, such as shown in FIG. 14, that uses an N-channel MOSFET as the main switching device Q1, and that performs DC—DC conversion by switching the main switching device Q1 on and off in accordance with a PWM control signal generated by a PWM control circuit 100. This configuration includes: a regulator circuit 200 which generates a predetermined voltage from an input voltage; a capacitor Cc which is provided between the regulator circuit 200 and the source of the main switching device Q1 and is charged up by the voltage supplied from the regulator circuit 200 via a diode Dc; and a driver circuit 300 which, in accordance with the circuit configuration shown in FIG. 15, selects either the voltage of the capacitor Cc or the source voltage of the main switching device Q1, depending on the PWM control signal generated by the PWM control circuit 100, and supplies the selected voltage to the gate of the main switching device Q1.

A flywheel diode Dd is included to provide a path for a current that flows from ground to inductance L when the main switching device Q1 is off.

In this configuration, the capacitor Cc is charged up while the main switching device Q1 is held in the off state by the driver circuit 300 selecting the source voltage for application to the gate in accordance with the PWM control signal. Then, when the driver circuit 300 selects the voltage of the capacitor Cc for supply to the gate in accordance with the PWM control signal, a voltage higher than the source voltage by the voltage of the capacitor Cc is input to the gate, causing the main switching device Q1 to turn on.

In this way, in the above prior art, the gate voltage necessary to turn on the N-channel MOSFET is generated by using the capacitor Cc that is provided between the regulator circuit 200 and the source of the main switching device Q1 and is charged up by the voltage supplied from the regulator circuit 200.

The prior art shown in FIG. 16 is also used. This prior art employs the configuration in which, after the output voltage of the DC—DC converter circuit has reached a predetermined voltage Vref, the capacitor Cc is charged up by the output voltage of the DC—DC converter circuit.

More specifically, the configuration includes: a comparator circuit 400 which outputs a high level when the output voltage of the DC—DC converter circuit is lower than the predetermined voltage Vref, and a low level when the output voltage reaches or exceeds the predetermined voltage Vref; a switching device Q3 constructed from a P-channel MOSFET which couples the output voltage of the DC—DC converter circuit to the capacitor Cc when the comparator circuit 400 outputs a low level; and a switching device Q4 constructed from a P-channel MOSFET which disconnects the capacitor Cc from the regulator circuit 200 when the comparator circuit 400 outputs a high level from its inverting output terminal. With this configuration, the capacitor Cc is charged up by the output voltage of the DC—DC converter circuit after the output voltage of the DC—DC converter circuit has reached the predetermined voltage Vref.

In the configuration of the prior art shown in FIG. 16, since the voltage drop across an N-channel MOSFET is smaller than the voltage drop across the flywheel diode Dd, the flywheel diode Dd is replaced by a synchronous commutation-type switching device Q2 constructed from an N-channel MOSFET, with a view to improving the conversion efficiency.

The configuration also includes a driver circuit 500 which, in accordance with the PWM control signal generated by the PWM control circuit 100, selects either ground potential or the drain voltage of the switching device Q4 for application to the gate of the synchronous commutation-type switching device Q2. More specifically, when the main switching device Q1 is turned off in accordance with the PWM control signal, the drain voltage of the switching device Q4 is selected and applied to the gate of the synchronous commutation-type switching device Q2, causing the synchronous commutation-type switching device Q2 to turn on; on the other hand, when the main switching device Q1 is turned on in accordance with the PWM control signal, ground potential is selected and applied to the gate of the synchronous commutation-type switching device Q2, causing the synchronous commutation-type switching device Q2 to turn off.

Turning back to FIG. 14, the prior art shown in the figure has the problem that the conversion efficiency drops because of a large loss in the regulator circuit 200.

The regulator circuit 200 is used to generate a predetermined voltage, irrespective of the magnitude of the input voltage, and is usually constructed from a linear regulator. As is well known, loss in the linear regulator is expressed as follows:

Loss in linear regulator=Vin×Iq+(Vin−Vout)×Iout where Vin: Input voltage
  Iq: Current consumption of linear regulator
  Vout: Output voltage of linear regulator
  Iout: Output current of linear regulator The loss here cannot be ignored since it is large enough to reduce the conversion efficiency of the DC—DC converter circuit. This problem is magnified when the output current of the DC—DC converter circuit is reduced, because the loss in the linear regulator becomes relatively large.

The loss in the regulator circuit 200 can be reduced by lowering the input voltage, but there is a limit to how much the input voltage can be lowered.

That is, the relation

Input voltage≦N-channel MOSFET drive voltage+ Voltage drop across regulator circuit must be satisfied. Usually, about 0.5 V must be allowed for the voltage drop across the regulator circuit 200 (linear regulator), and this imposes a limit on how much the input voltage can be lowered. Accordingly, the loss in the regulator circuit 200 cannot be reduced below a certain level.

On the other hand, in the prior art shown in FIG. 16, the problem of reduced conversion efficiency of the DC—DC converter circuit due to the loss in the regulator circuit 200 does not occur because the regulator circuit 200 is disconnected once the output voltage of the DC—DC converter circuit has risen. However, since the N-channel MOSFET that can be used in practice as the main switching device Q1 is one that operates with 5 V, the prior art has the problem that it cannot be applied to loads operating with voltages lower than 5 V.

Nowadays, battery-operated apparatuses operating with 2 to 3 volts are becoming widespread. If the DC—DC converter circuit shown in FIG. 16 is to be used to supply power to such loads, since the capacitor Cc is charged up using the output voltage of the DC—DC converter circuit, an N-channel MOSFET that operates with 2 to 3 volts must be used as the main switching device Q1.

However, in the case of N-channel MOSFETs of 2 to 3 V type, the ON resistance is large, the current handling capacity is low, and the source-drain breakdown voltage is small, making this type of MOSFET unfit for power control applications. In practice, the prior art shown in FIG. 16 cannot be applied to load operating with voltages lower than 5 V.

SUMMARY OF THE INVENTION

The present invention has been devised in view of the above situation, and an object of the invention is to provide a novel DC—DC converter circuit that achieves high conversion efficiency, while at the same time, making it possible to supply low voltages.

To achieve the above object, according to the present invention, there is provided a DC—DC converter circuit for performing DC—DC conversion by switching an input voltage on and off in accordance with an operation control signal using a main switching device, comprising: a level shift circuit which generates a voltage that is lower than the input voltage by a predetermined voltage; a power supply generating circuit which generates a floating power supply having a magnitude equal to the difference between the input voltage and the output voltage of the level shift circuit; a capacitor which is charged up by the floating power supply generated by the power supply generation circuit; and a driver circuit which supplies a charged voltage of the capacitor as a driving voltage to the main switching device in accordance with the operation control signal.

According to the present invention, there is also provided a DC—DC converter circuit for performing DC—DC conversion by switching an input voltage on and off in accordance with an operation control signal using a main switching device, comprising: a level shift circuit which generates a voltage that is lower than the input voltage by a predetermined voltage; a power supply generating circuit which generates a floating power supply having a magnitude equal to the difference between the input voltage and the output voltage of the level shift circuit; and a driver circuit which supplies the voltage of the floating power supply generated by the power supply generating circuit as a driving voltage to the main switching device in accordance with the operation control signal.

BRIEF DESCRIPTION OF THE DRAWINGS

Further features and advantages of the present invention will be apparent from the following description with reference to the accompanying drawings, in which.

DESCRIPTION OF THE PREFERRED EMBODIMENTS

The present invention will be described in detail below with reference to embodiments.

Figure 1:
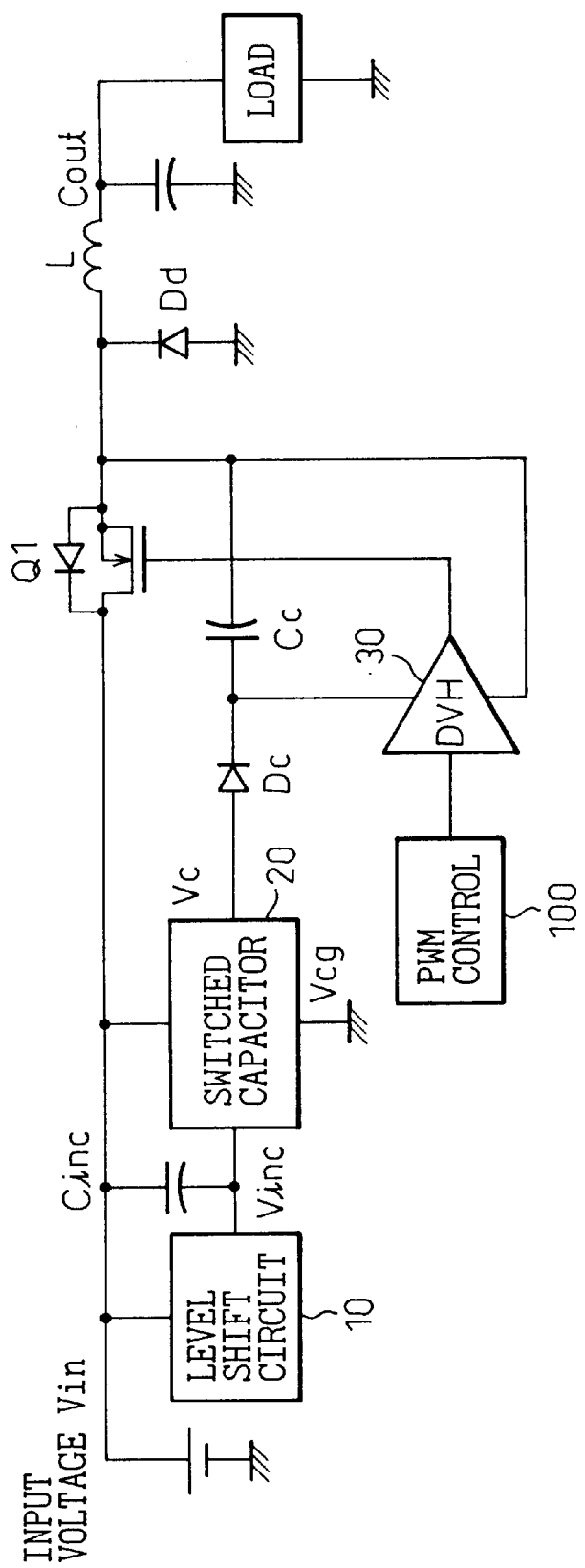
FIG. 1 is a circuit diagram showing one embodiment of a DC—DC converter circuit according to the present invention.
Figure 2:
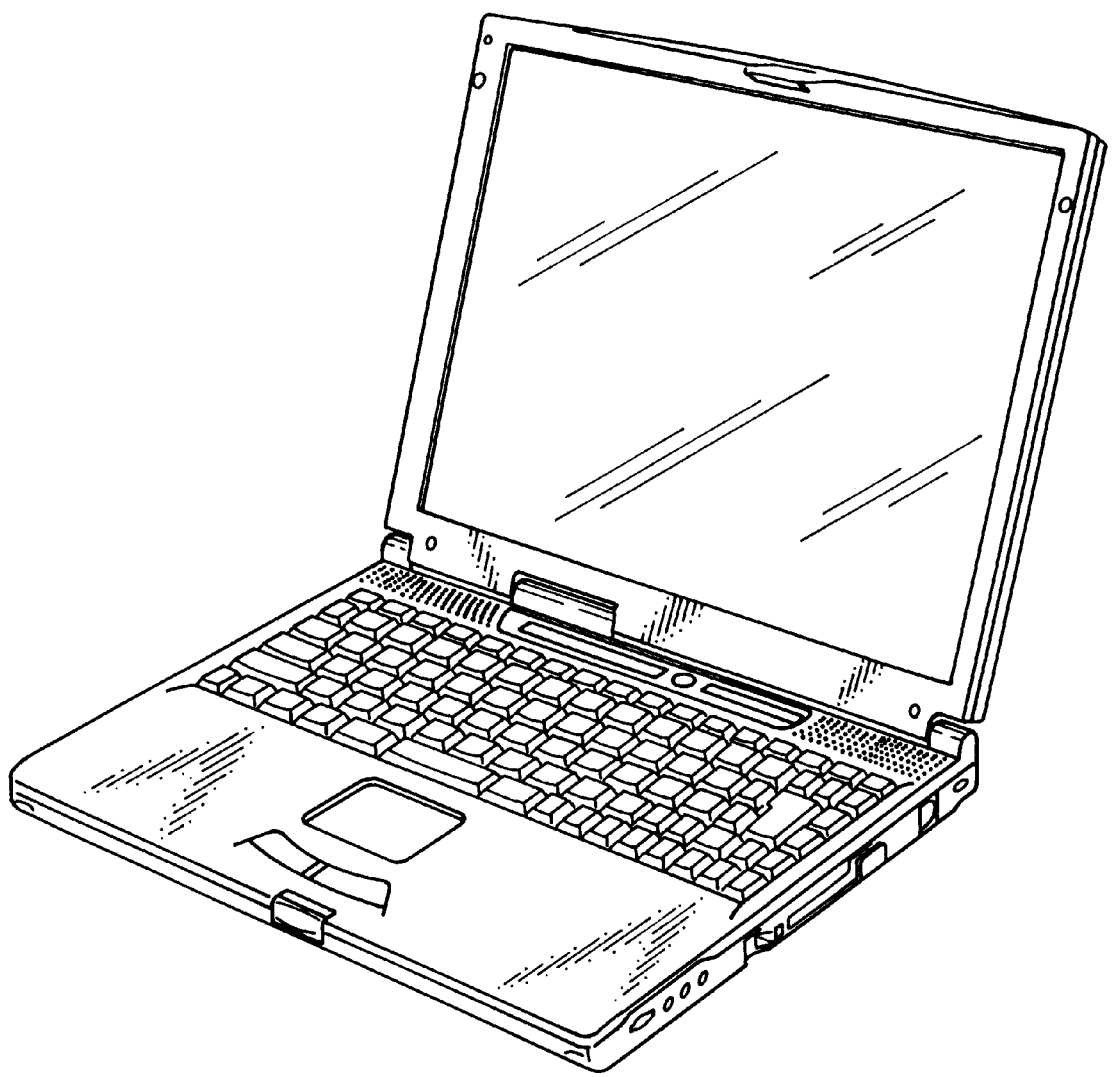
FIG. 2 is a perspective view of an apparatus in which the DC—DC converter circuit according to the present invention is mounted.
Figure 15:
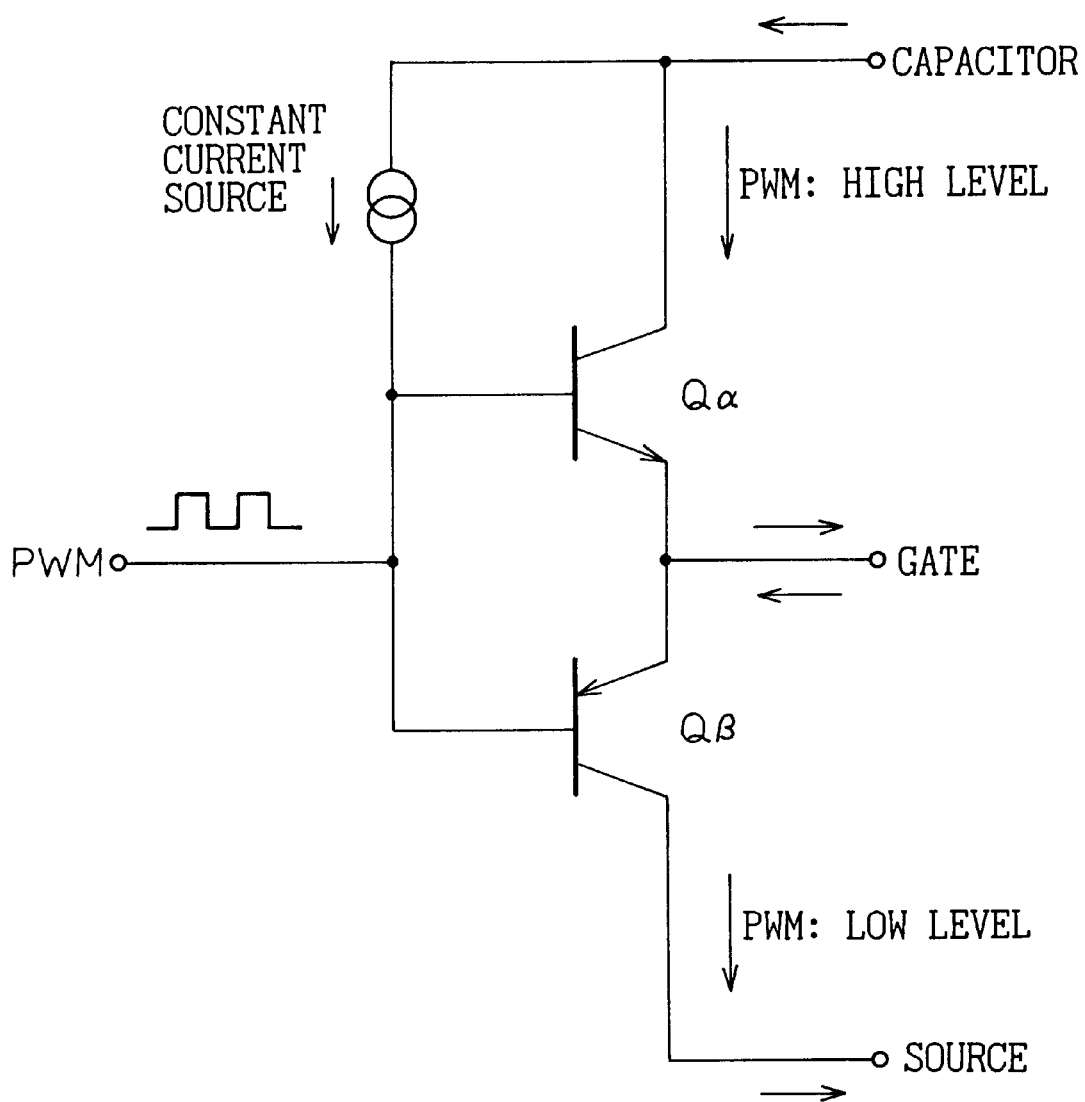
FIG. 15 is a circuit diagram of a driver circuit.
Figure 16:
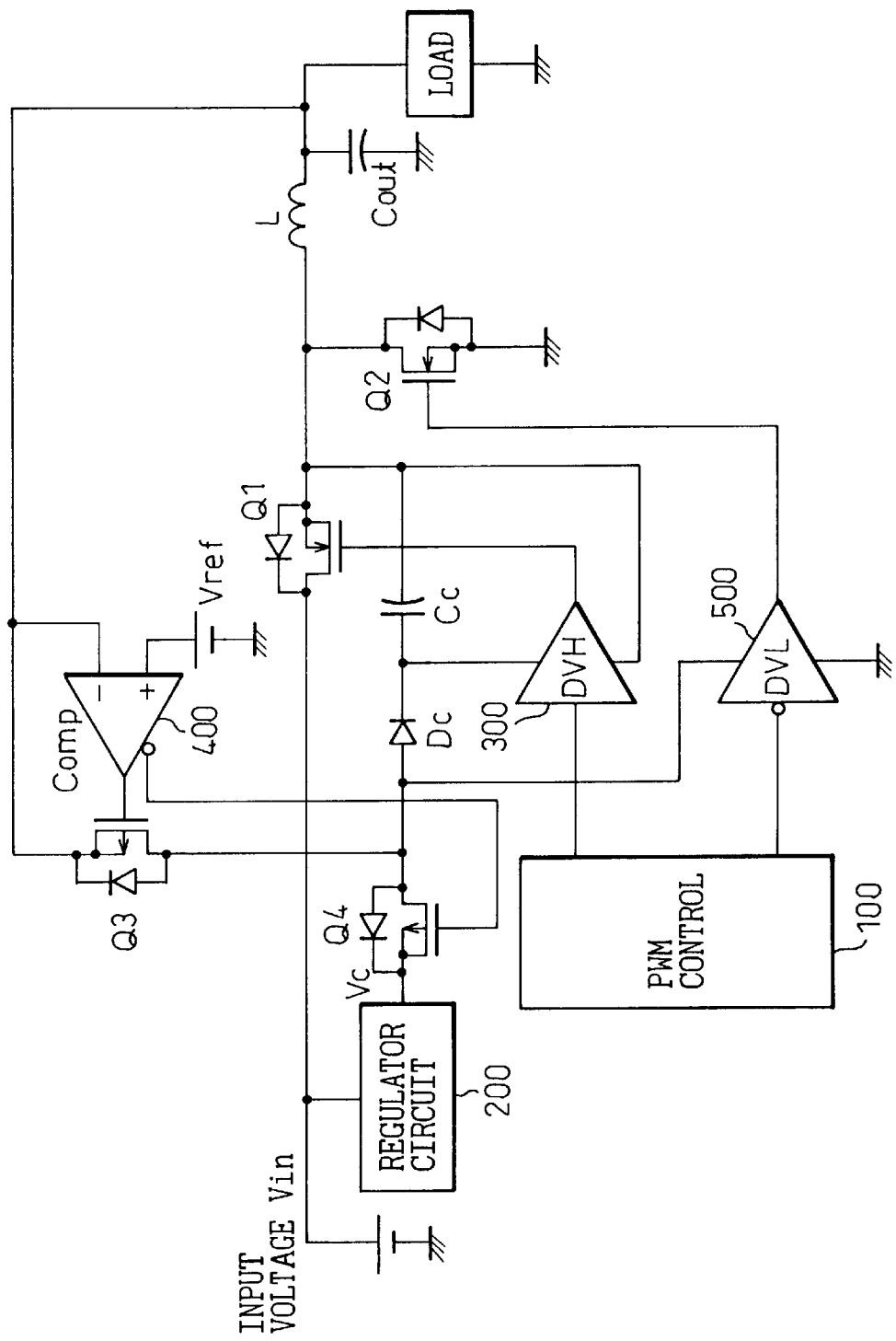
FIG. 16 is a circuit diagram of another DC—DC converter circuit according to the prior art.

FIG. 1 shows one embodiment of the DC—DC converter circuit of the present invention. The DC—DC converter circuit of the invention according to this embodiment is mounted in a notebook-sized PC such as shown in FIG. 2. The DC—DC converter circuit shown here employs the configuration that uses an N-channel MOSFET as the main switching device Q1 and that performs DC—DC conversion by switching the main switching device Q1 on and off in accordance with a PWM control signal generated by a PWM control circuit 100, and comprises: a level shift circuit 10 which takes an input voltage Vin as an input and generates a voltage Vinc that is lower than the input voltage Vin by a predetermined voltage; a switched capacitor circuit 20 which takes the input voltage Vin and the output voltage Vinc of the level shift circuit 10 as inputs and generates a floating power supply having a magnitude equal to the difference between the two voltages, and whose negative potential side output terminal is grounded; a capacitor Cc which is provided between the positive potential side output terminal of the switched capacitor 20 and the source of the main switching device Q1 and is charged up by the voltage supplied from the switched capacitor circuit 20 via a diode Dc; and a driver circuit 30 which, in accordance with the circuit configuration shown in FIG. 15, selects either the voltage of the capacitor Cc or the source voltage of the main switching device Q1, depending on the PWM control signal generated by the PWM control circuit 100, and supplies the selected voltage to the gate of the main switching device Q1.

A flywheel diode Dd is included to provide a path for a current that flows from ground to inductance L when the main switching device Q1 is off.

Figure 3:
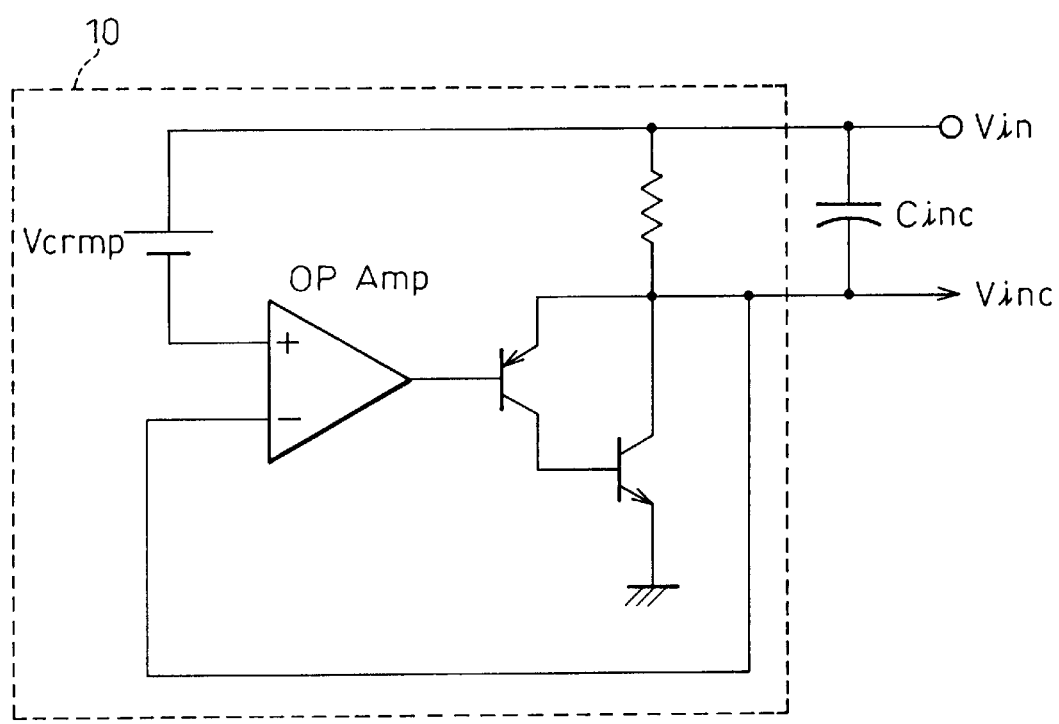
FIG. 3 is a circuit diagram showing one embodiment of a level shift circuit.
Figure 4:
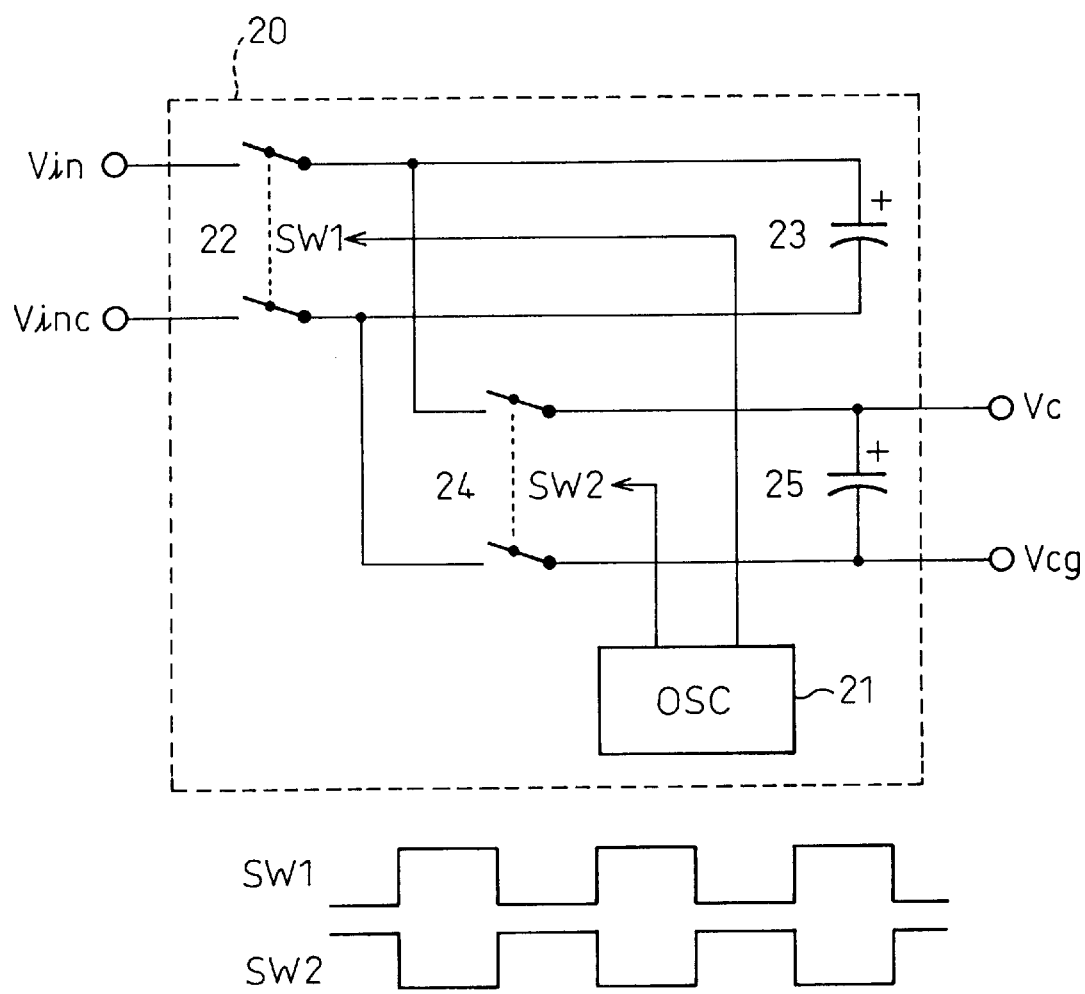
FIG. 4 is a circuit diagram showing one embodiment of a switched capacitor circuit.

FIG. 3 shows one embodiment of the level shift circuit 10, and FIG. 4 shows one embodiment of the switched capacitor circuit 20. The level shift circuit 10, in accordance with the circuit configuration of FIG. 3, operates to generate and output the voltage Vinc (=Vin−Vcrmp) that is lower than the input voltage Vin by a predetermined level shift voltage Vcrmp.

On the other hand, the switched capacitor circuit 20, as shown in FIG. 4, comprises: a first switch 22 which takes the input voltage Vin and the output voltage Vinc of the level shift circuit 10 as inputs and operates to open and close in accordance with an oscillator signal of a predetermined frequency output from an oscillator 21; a first capacitor 23 which is charged when the first switch 22 is closed; a second switch 24 which takes the charged voltage of the first capacitor 23 as an input and operates to open and close in complementary fashion to the first switch 22 in accordance with the oscillator signal output from the oscillator 21; and a second capacitor 25 which is charged when the second switch 24 is closed.

In accordance with this configuration, the switched capacitor circuit 20 operates to generate a floating power supply having a magnitude equal to the difference between the input voltage Vin and the output voltage Vinc of the level shift circuit 10.

Figure 5:
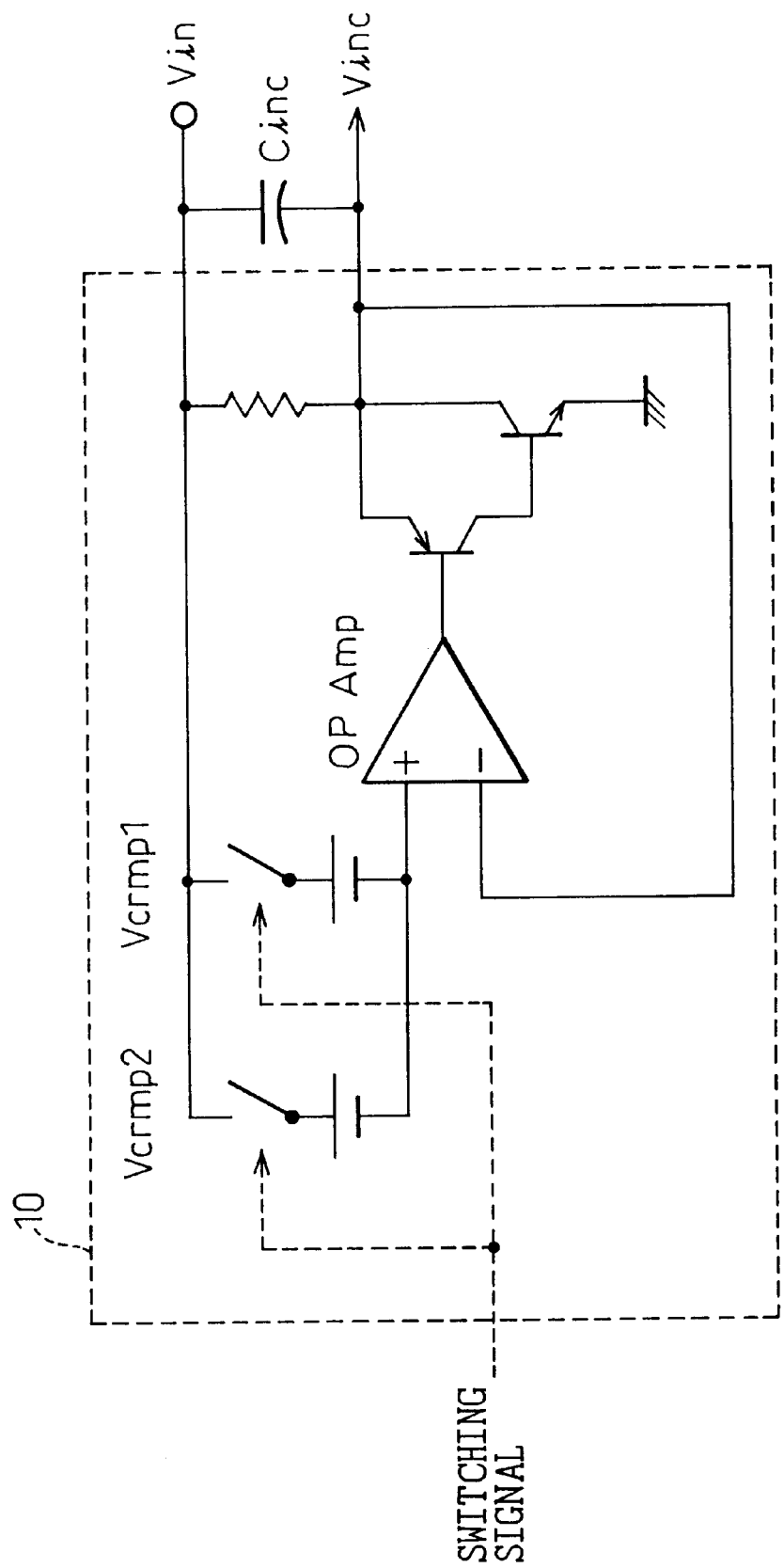
FIG. 5 is a circuit diagram showing another embodiment of the level shift circuit.

Instead of the circuit configuration shown in FIG. 3, the level shift circuit 10 may be implemented using the circuit configuration shown in FIG. 5 in which a plurality of level shift voltages Vcrmp are provided, allowing one of the level shift voltages to be selected so that the output voltage can be varied in accordance with an externally issued instruction. With this circuit configuration, it becomes possible to address situations where the input voltage Vin is changed or the input voltage Vin drops.

Figure 6:
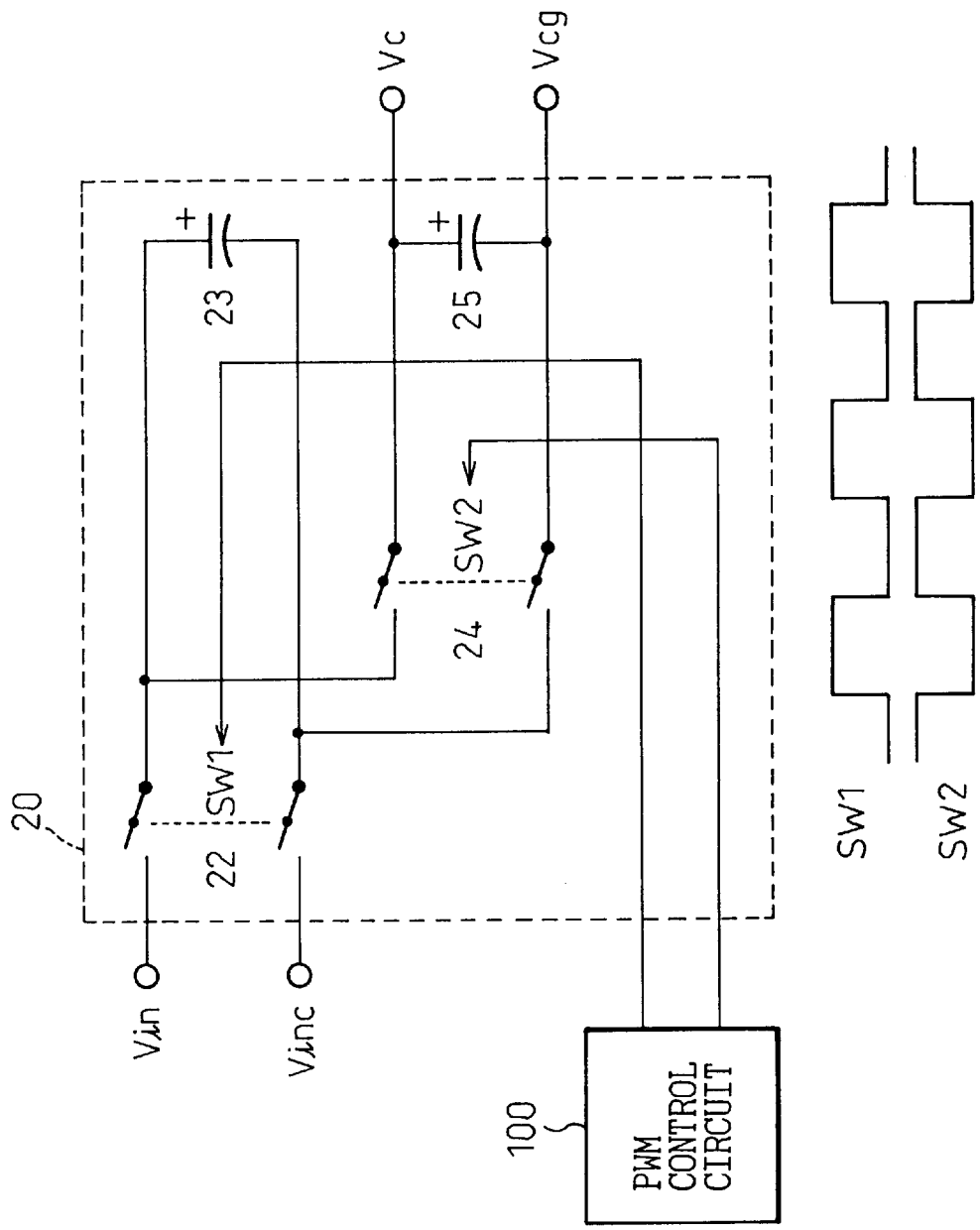
FIG. 6 is a circuit diagram showing another embodiment of the switched capacitor circuit.

As for the switched capacitor circuit 20, the embodiment of FIG. 4 requires the provision of the oscillator 21, but if the PWM control signal generated by the PWM control circuit 100 is used to control the switch action of the first and second switches 22 and 24, as shown in FIG. 6, the oscillator 21 can be omitted and power consumption can be reduced as compared with the configuration that uses the oscillator 21.

In the thus configured embodiment of FIG. 1, the level shift circuit 10 generates and outputs the voltage Vinc that is lower than the input voltage Vin by the predetermined level shift voltage Vcrmp, and the switched capacitor circuit 20 then generates a floating power supply having a magnitude equal to the difference between the input voltage Vin and the output voltage Vinc of the level shift circuit 10.

On the other hand, the driver circuit 30 causes the main switching device Q1 to turn off by selecting the source voltage of the main switching device Q1 in accordance with the PWM control signal and supplying it to the gate of the main switching device Q1. At this time, the capacitor Cc is charged up by the power supply from the switched capacitor circuit 20.

Next, the driver circuit 30 causes the main switching device Q1 to turn on by selecting the voltage of the capacitor Cc in accordance with the PWM control signal and supplying it to the gate of the main switching device Q1, thereby applying the voltage of the capacitor Cc plus the source voltage of the main switching device Q1 to the gate of the main switching device Q1.

In this way, in the embodiment of FIG. 1, energization of the main switching device Q1 is controlled by charging up the capacitor Cc using the floating power supply generated by the switched capacitor circuit 20.

As previously described, loss in the regulator circuit 200 used in the prior art is Current consumption of regulator circuit×Vin+(Vin−Vout)×Iout where Vin: Input voltage
Vout: Output voltage
Iout: Output current In contrast, loss in the level shift circuit 10 used in the present invention is Current consumption of level shift circuit×Vin+Power consumption of switched capacitor circuit≈Current consumption of level shift circuit×Vin where Vin: Input voltage This is advantageous since power consumption due to the term "(Vin−Vout)×Iout" is eliminated.

Furthermore, while the voltage drop across the regulator circuit 200 used in the prior art is about 0.5 V, the voltage drop across the switched capacitor circuit 20 used in the present invention is 0.1 V or less, so that the input voltage Vin can be set lower than in the prior art. As a result, the power consumption defined by "Current consumption of level shift circuit×Vin" becomes smaller than the power consumption defined by "Current consumption of regulator circuit×Vin."

Thus, according to the embodiment of FIG. 1, the DC—DC conversion efficiency can be increased compared with the prior art. Furthermore, since the configuration does not use the output voltage of the DC—DC converter circuit to charge up the capacitor Cc, an N-channel MOSFET suitable for power control can be used for the main switching device Q1 even in applications where the voltage to be supplied to the load is small.

Figure 7:
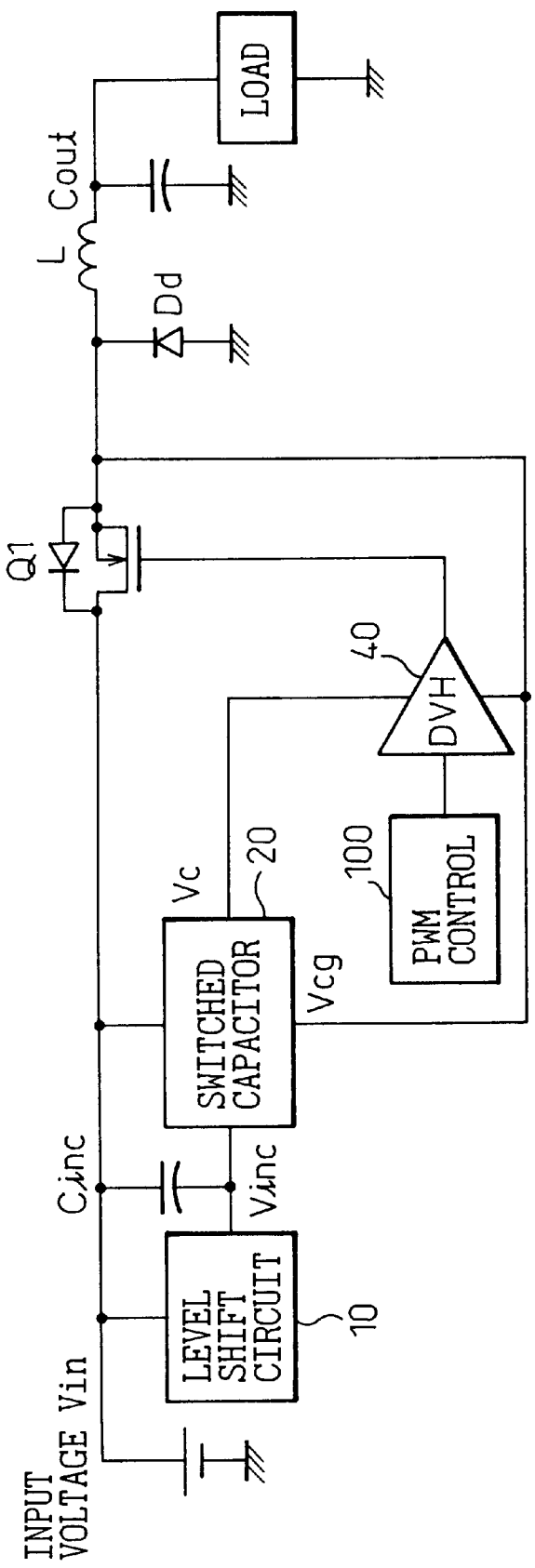
FIG. 7 is a circuit diagram showing another embodiment of the DC—DC converter circuit according to the present invention.

FIG. 7 shows another embodiment of the DC—DC converter circuit of the present invention. The configuration of this embodiment dispenses with the capacitor Cc and diode Dc used in the embodiment of FIG. 1. That is, the negative potential side output terminal of the switched capacitor circuit 20 is connected to the source of the main switching device Q1 constructed from an N-channel MOSFET, and the driver circuit 30 is replaced by a driver circuit 40 which selects either the output voltage at the positive potential side output terminal of the switched capacitor circuit 20 or the source voltage of the main switching device Q1 in accordance with the PWM control signal generated by the PWM control circuit 100, and supplies the selected voltage to the gate of the main switching device Q1.

With this configuration, since the capacitor 25 in the switched capacitor circuit 20 can also be used to serve as the capacitor Cc provided in the embodiment of FIG. 1, the capacitor Cc and diode Dc needed in the embodiment of FIG. 1 can be omitted.

According to this embodiment, the need for the diode Dc provided in the embodiment of FIG. 1 to prevent reverse current flow is eliminated, and hence no voltage drop due to the diode Dc, thus allowing the input voltage Vin to be set further lower. The DC—DC conversion efficiency can thus be increased further, compared with the embodiment of FIG. 1.

Figure 8:
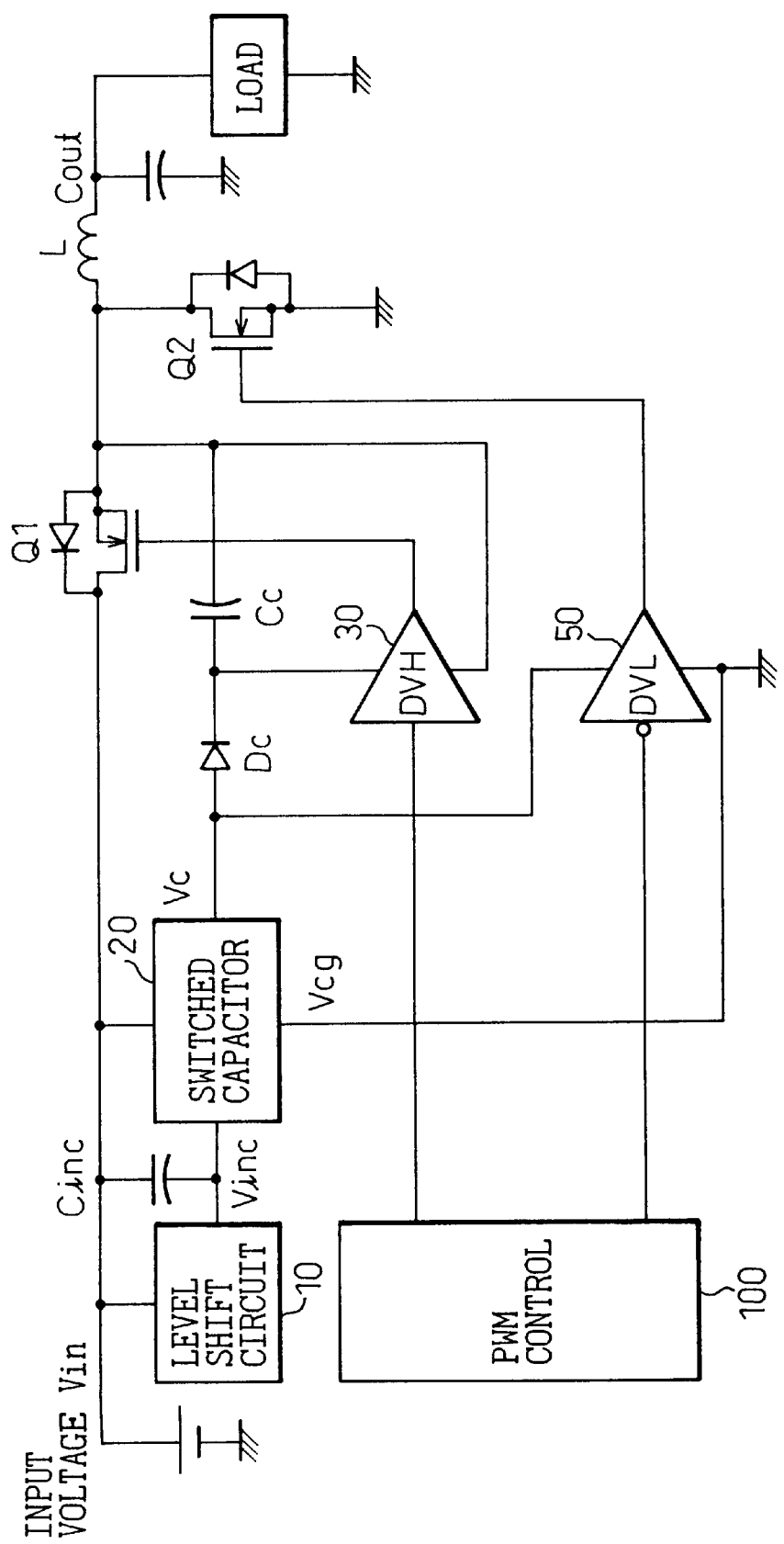
FIG. 8 is a circuit diagram showing still another embodiment of the DC—DC converter circuit according to the present invention.

FIG. 8 shows still another embodiment of the DC—DC converter circuit of the present invention. In this embodiment, the flywheel diode Dd provided in the embodiment of FIG. 1 is replaced by a synchronous commutation-type switching device Q2 constructed from an N-channel MOSFET.

In operation, the synchronous commutation-type switching device Q2 is turned off when the main switching device Q1 is turned on, and turned on when the main switching device Q1 is turned off. To achieve this operation, the embodiment of FIG. 8 comprises, in addition to the configuration of the embodiment of FIG. 1, a driver circuit 50 which, in accordance with the PWM control signal generated by the PWM control circuit 100, selects either ground potential or the output voltage of the switched capacitor circuit 20 for application to the gate of the synchronous commutation-type switching device Q2.

When the driver circuit 30 causes the main switching device Q1 to turn on in accordance with the PWM control signal generated by the PWM control circuit 100, the driver circuit 50 causes the synchronous commutation-type switching device Q2 to turn off by selecting the ground potential for application to the gate of the synchronous commutation-type switching device Q2. On the other hand, when the driver circuit 30 causes the main switching device Q1 to turn off in accordance with the PWM control signal generated by the PWM control circuit 100, the driver circuit 50 causes the synchronous commutation-type switching device Q2 to turn on by selecting the output voltage of the switched capacitor circuit 20 for application to the gate of the synchronous commutation-type switching device Q2.

According to this embodiment, since the voltage drop across the N-channel MOSFET is smaller than voltage drop across the flywheel diode Dd, the DC—DC conversion efficiency can be further increased, compared with the embodiment of FIG. 1.

Figure 9:
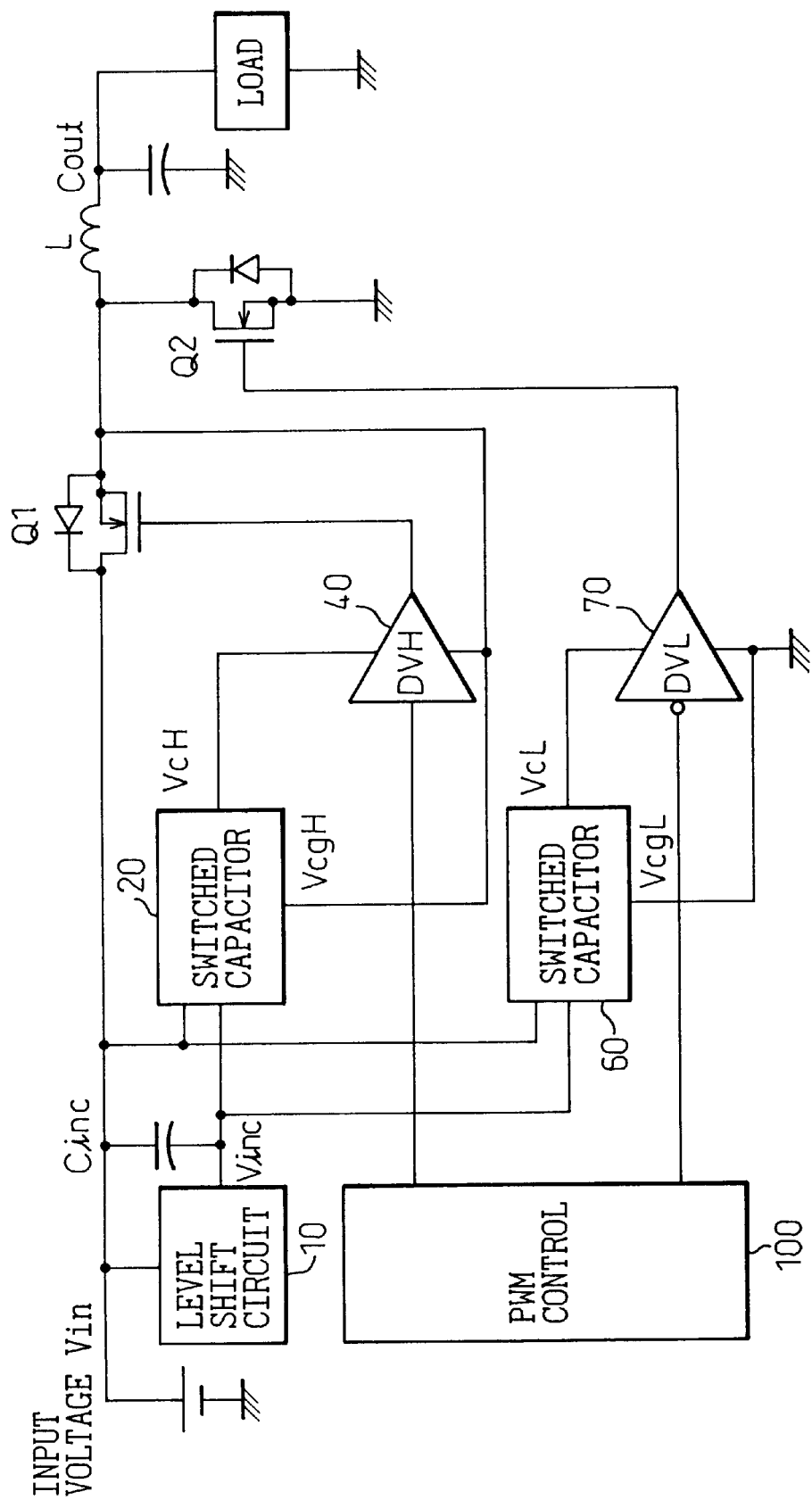
FIG. 9 is a circuit diagram showing a further embodiment of the DC—DC converter circuit according to the present invention.

FIG. 9 shows a further embodiment of the DC—DC converter circuit of the present invention. In this embodiment, the flywheel diode Dd provided in the embodiment of FIG. 7 is replaced by a synchronous commutation-type switching device Q2 constructed from an N-channel MOSFET.

In operation, the synchronous commutation-type switching device Q2 is turned off when the main switching device Q1 is turned on, and turned on when the main switching device Q1 is turned off. To achieve this operation, the embodiment of FIG. 9 comprises, in addition to the configuration of the embodiment of FIG. 7, a second switched capacitor circuit 60 which is identical in configuration to the switched capacitor circuit 20 and generates a floating power supply, and whose negative potential side output terminal is grounded, and a driver circuit 70 which, in accordance with the PWM control signal generated by the PWM control circuit 100, selects either ground potential or the output voltage of the second switched capacitor circuit 60 for application to the gate of the synchronous commutation-type switching device Q2.

When the driver circuit 40 causes the main switching device Q1 to turn on in accordance with the PWM control signal generated by the PWM control circuit 100, the driver circuit 70 causes the synchronous commutation-type switching device Q2 to turn off by selecting the ground potential for application to the gate of the synchronous commutation-type switching device Q2. On the other hand, when the driver circuit 40 causes the main switching device Q1 to turn off in accordance with the PWM control signal generated by the PWM control circuit 100, the driver circuit 70 causes the synchronous commutation-type switching device Q2 to turn on by selecting the output voltage of the second switched capacitor circuit 60 for application to the gate of the synchronous commutation-type switching device Q2.

According to this embodiment, since the voltage drop across the N-channel MOSFET is smaller than voltage drop across the flywheel diode Dd, the DC—DC conversion efficiency can be further increased, compared with the embodiment of FIG. 7.

Figure 10:
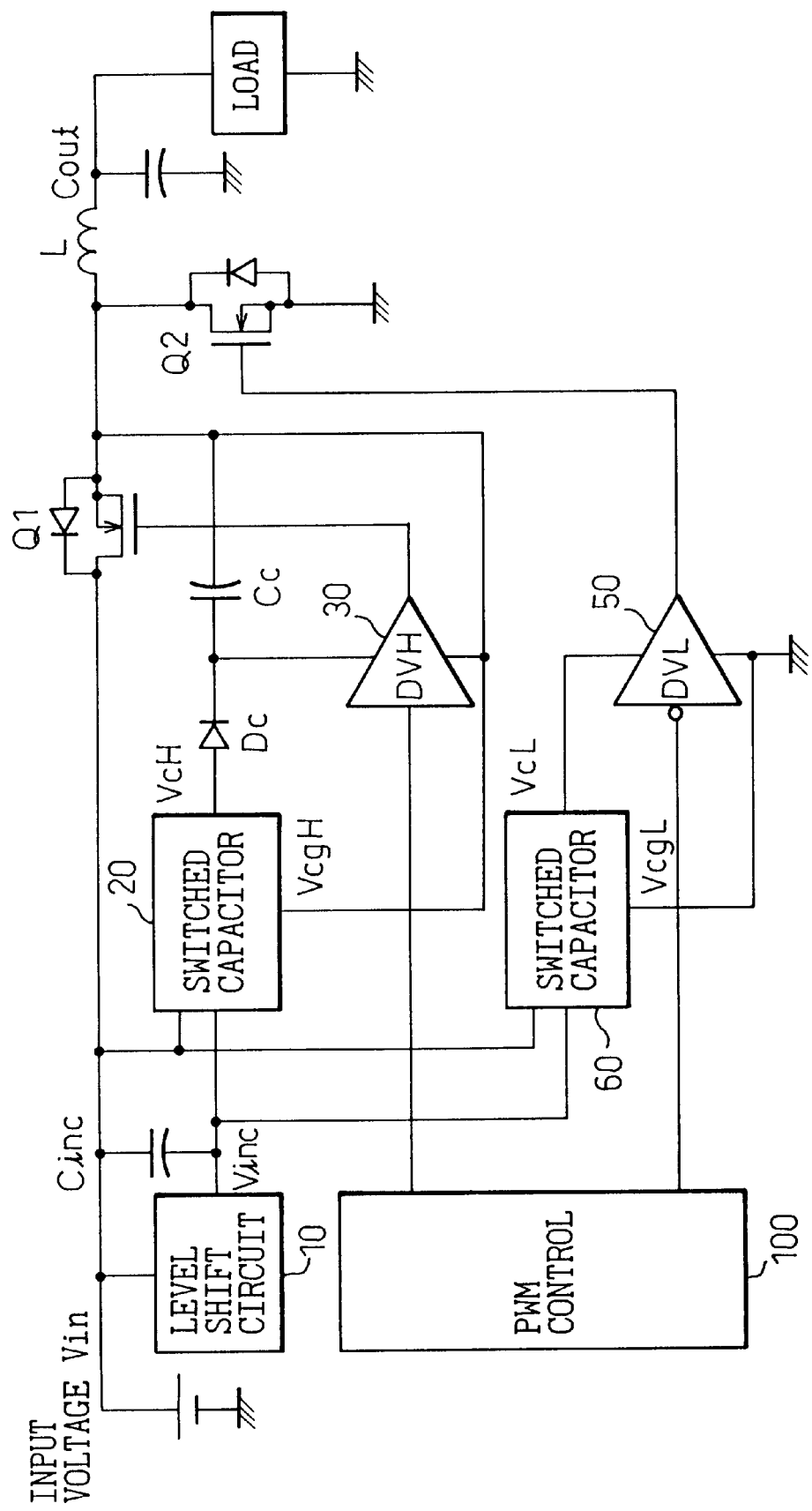
FIG. 10 is a circuit diagram showing a still further embodiment of the DC—DC converter circuit according to the present invention.

FIG. 10 shows a still further embodiment of the DC—DC converter circuit of the present invention. This embodiment is based on the embodiment of FIG. 8, the difference being that a second switched capacitor circuit 60 is included which is identical in configuration to the switched capacitor circuit 20 and generates a floating power supply, and whose negative potential side output terminal is grounded, and therefore that the driver circuit 50 is configured to select the output voltage of the second switched capacitor circuit 60 instead of the output voltage of the switched capacitor circuit 20.

With this embodiment also, the same DC—DC conversion efficiency as obtained in the embodiment of FIG. 8 can be achieved.

Figure 11:
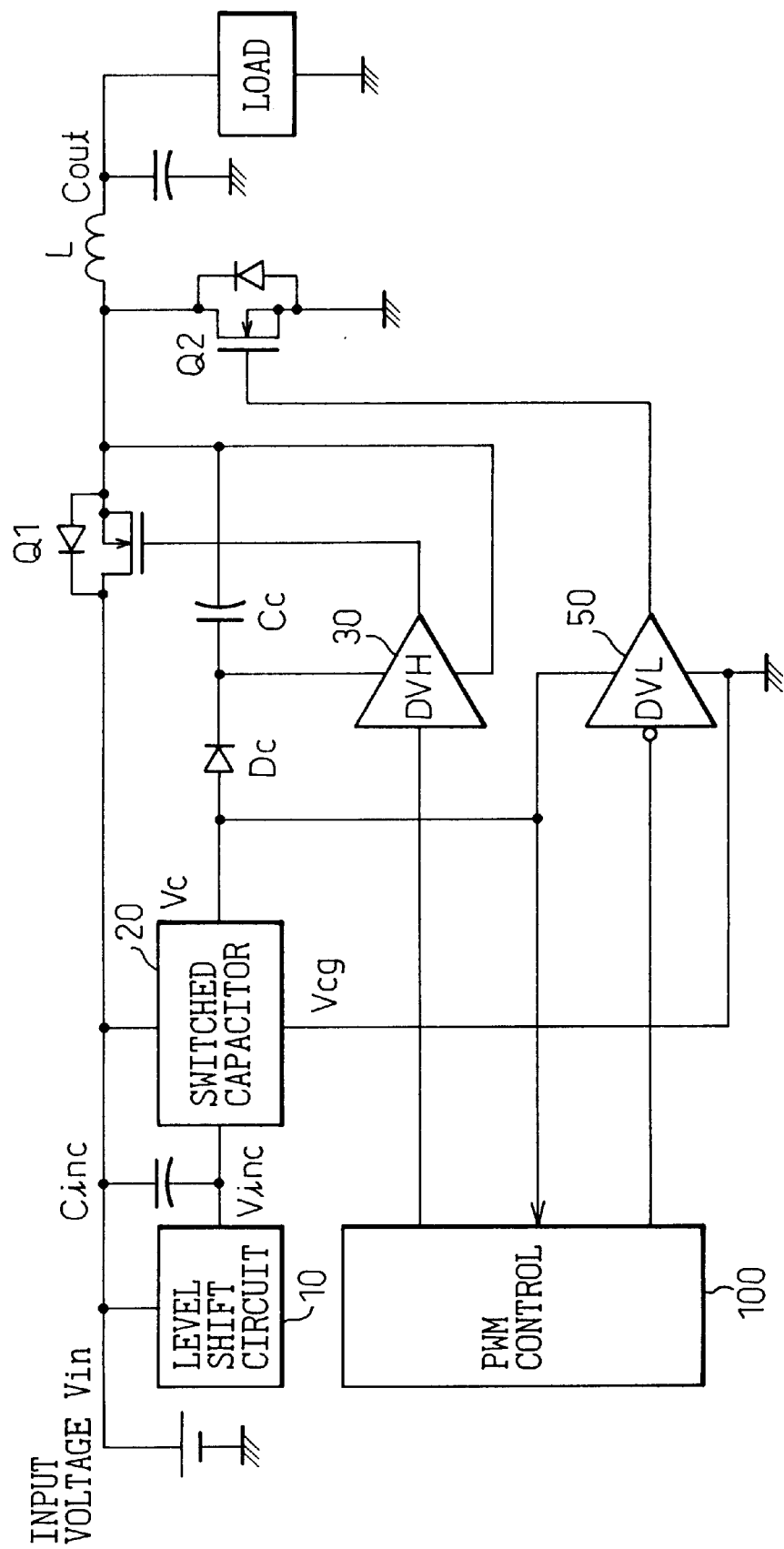
FIG. 11 is a circuit diagram showing a yet further embodiment of the DC—DC converter circuit according to the present invention.

FIG. 11 shows a yet further embodiment of the DC—DC converter circuit of the present invention. This embodiment is fundamentally the same as the embodiment of FIG. 8, except that the floating power supply generated by the switched capacitor circuit 20 is used as a power supply for the PWM control circuit 100. With this configuration, the power supply for the PWM control circuit 100 need not be provided separately.

Figure 12:
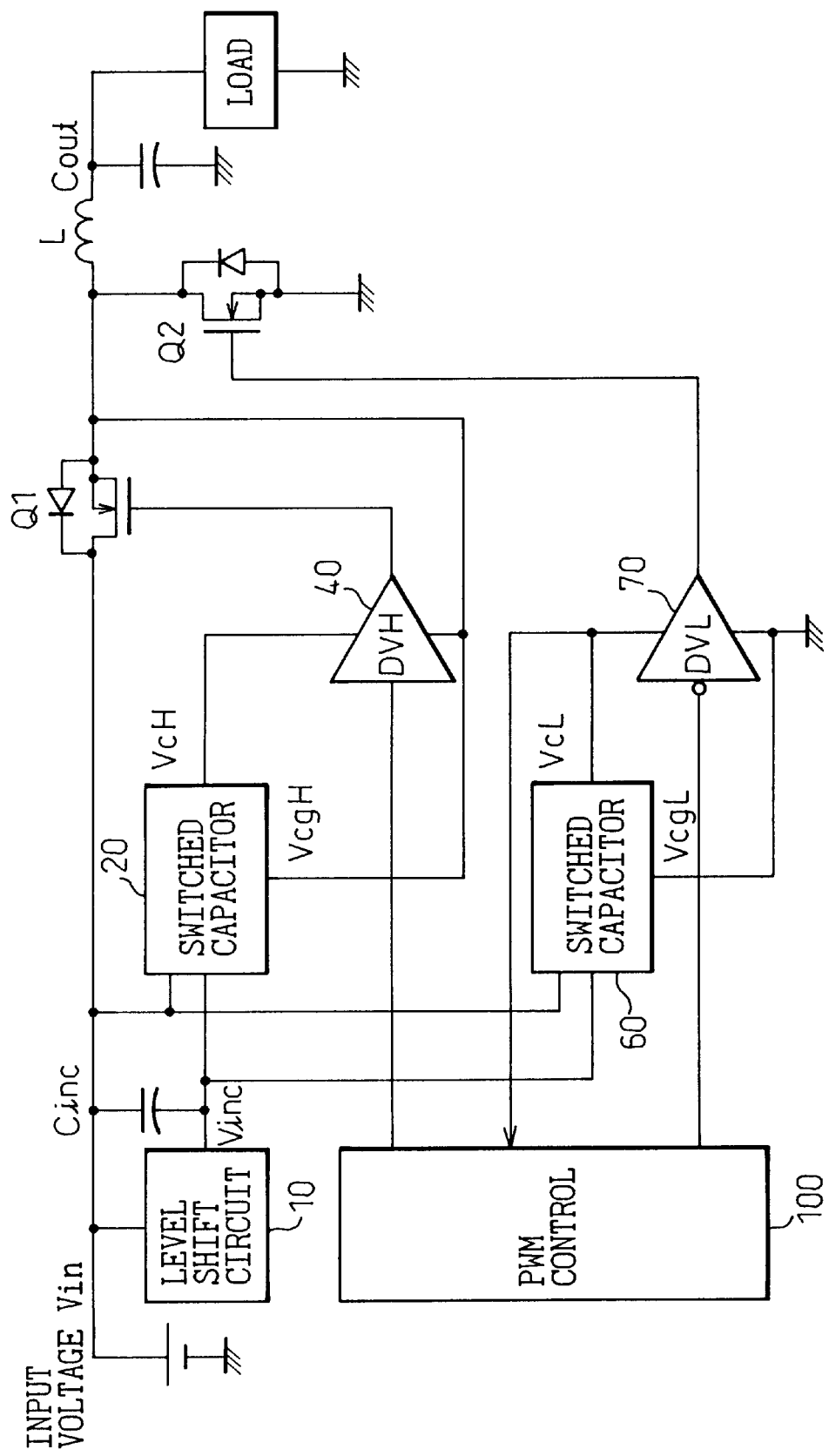
FIG. 12 is a circuit diagram showing another embodiment of the DC—DC converter circuit according to the present invention.

FIG. 12 shows another embodiment of the DC—DC converter circuit of the present invention. This embodiment is fundamentally the same as the embodiment of FIG. 9, except that the floating power supply generated by the second switched capacitor circuit 60 is used as a power supply for the PWM control circuit 100. With this configuration, the power supply for the PWM control circuit 100 need not be provided separately.

Figure 13:
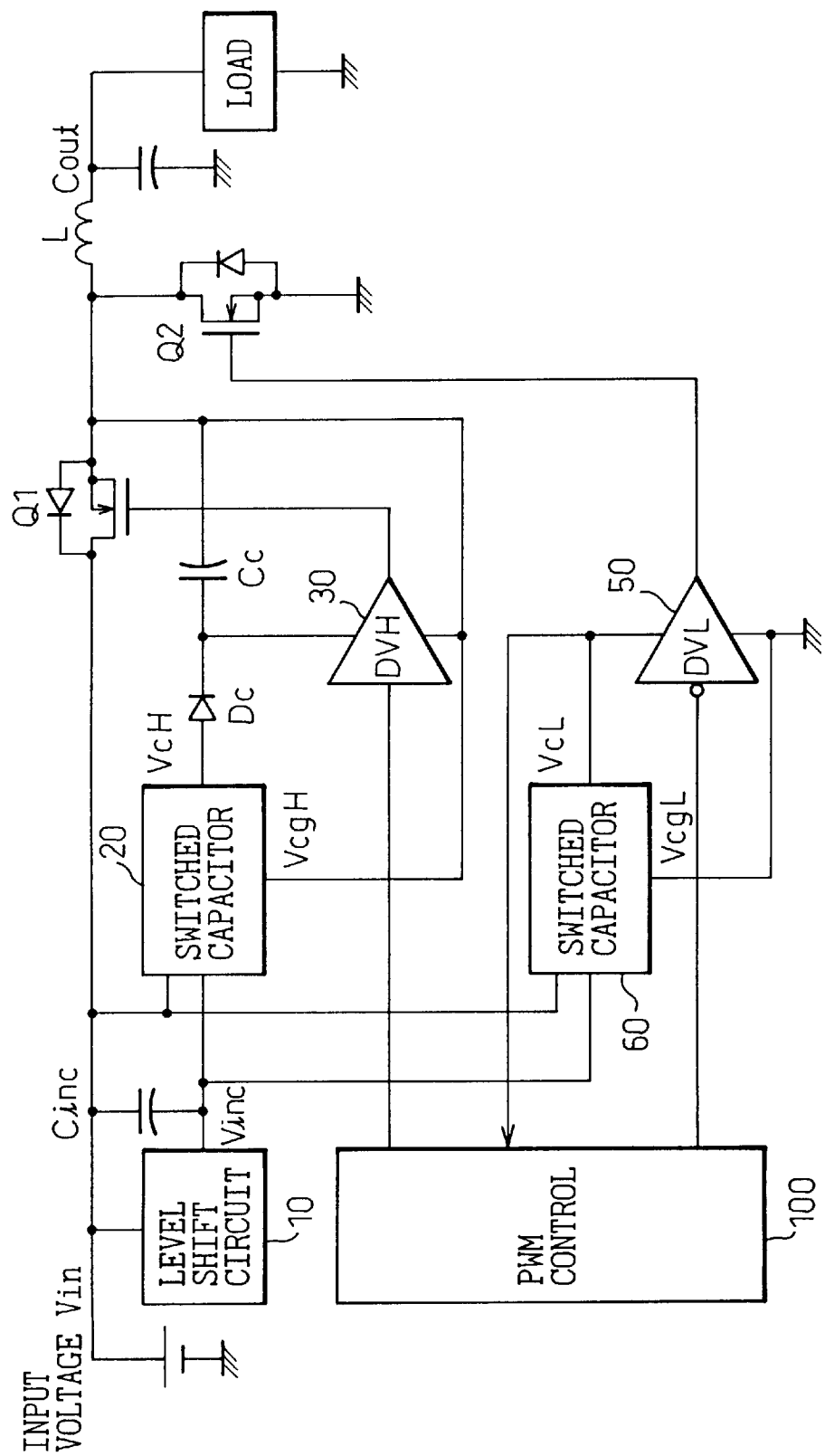
FIG. 13 is a circuit diagram showing still another embodiment of the DC—DC converter circuit according to the present invention.
Figure 14:
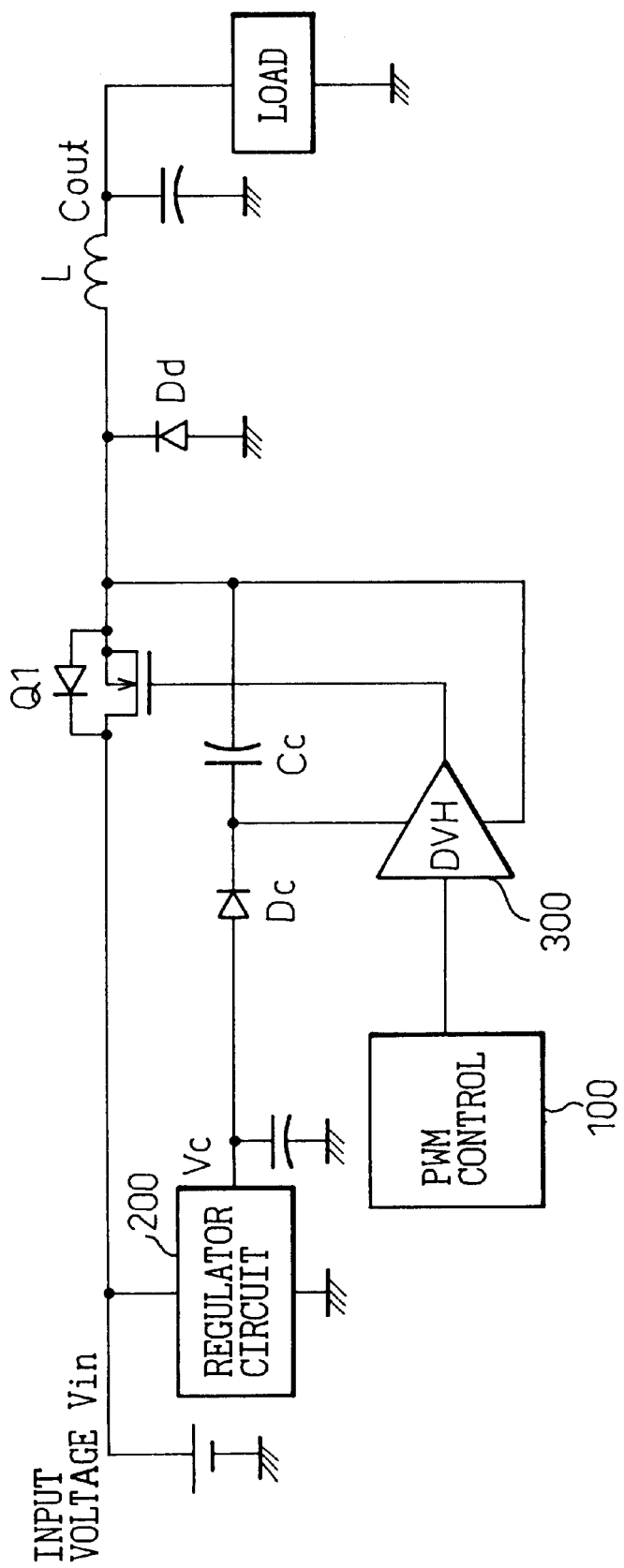
FIG. 14 is a circuit diagram of a DC—DC converter circuit according to the prior art.

FIG. 13 shows another embodiment of the DC—DC converter circuit of the present invention. This embodiment is fundamentally the same as the embodiment of FIG. 10, except that the floating power supply generated by the second switched capacitor circuit 60 is used as a power supply for the PWM control circuit 100. With this configuration, the power supply for the PWM control circuit 100 need not be provided separately.

While the invention has been described with respect to several preferred embodiments, it will be appreciated that the invention is not limited to those illustrated herein. For example, the level shift circuit 10 is not limited in configuration to that shown in FIG. 3 or 5, and likewise, neither the switched capacitor circuit 20 nor the second switched capacitor circuit 60 is limited to the particular example shown in FIG. 4 or 6.

As described above, in the DC—DC converter circuit of the invention, the floating power supply is generated by using the level shift circuit with low power consumption and the power supply generating circuit with a small voltage drop, and the operation of the main switching device is controlled by using this floating power supply as the driving voltage. This configuration achieves high conversion efficiency.

Furthermore, since the configuration of the invention does not use the output voltage of the DC—DC converter circuit to control the operation of the main switching device, a device suitable for power control can be used for the main switching device even in applications where the voltage to be supplied to the load is small.

The invention has also been described as including a synchronous commutation—type switching device to improve the conversion efficiency. In this case also, since the floating power supply is generated in a like manner and used to control the operation of the synchronous commutation-type switching device, high conversion efficiency can be achieved.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A DC—DC converter circuit for performing DC—DC conversion by switching an input voltage on and off in accordance with an operation control signal using a main switching device, comprising:
   a level shift circuit which generates a voltage that is lower than said input voltage by a predetermined voltage;
   a power supply generating circuit which generates a floating power supply having a magnitude equal to the difference between said input voltage and the output voltage of said level shift circuit;
   a capacitor which is charged up by said floating power supply generated by said power supply generating circuit; and
   a driver circuit which supplies a charged voltage of said capacitor as a driving voltage to said main switching device in accordance with said operation control signal.

2. A DC—DC converter circuit for performing DC—DC conversion by switching an input voltage on and off in accordance with an operation control signal using a main switching device, comprising:
   a level shift circuit which generates a voltage that is lower than said input voltage by a predetermined voltage;
   a power supply generating circuit which generates a floating power supply having a magnitude equal to the difference between said input voltage and the output voltage of said level shift circuit; and
   a driver circuit which supplies the voltage of said floating power supply generated by said power supply generating circuit as a driving voltage to said main switching device in accordance with said operation control signal.

3. A DC—DC converter circuit as claimed in claim 1, wherein a flywheel diode function is implemented using a synchronous commutation-type switching device which is turned on and off in a complementary operation mode to said main switching device, said DC—DC converter circuit further comprising:
   a second driver circuit which supplies the voltage of said floating power supply generated by said power supply generating circuit as a driving voltage to said synchronous commutation-type switching device in accordance with said operation control signal.

4. A DC—DC converter circuit as claimed in claim 1 or 2, wherein a flywheel diode function is implemented using a synchronous commutation-type switching device which is turned on and off in a complementary operation mode to said main switching device, said DC—DC converter circuit further comprising:
   a second power supply generating circuit which generates a floating power supply having a magnitude equal to the difference between said input voltage and the output voltage of said level shift circuit; and
   a second driver circuit which supplies the voltage of said floating power supply generated by said second power supply generating circuit as a driving voltage to said synchronous commutation-type switching device in accordance with said operation control signal.

5. A DC—DC converter circuit as claimed in claim 1, 2, or 3, wherein said floating power supply generated by said power supply generating circuit is used as a power supply for a circuit that generates said operation control signal.

6. A DC—DC converter circuit as claimed in claim 1, 2, or 3, wherein said power supply generating circuit comprises:
   a first circuit having a first switch which is opened and closed in accordance with a prescribed oscillator signal, and a first capacitor which is charged up by being supplied with said input voltage and the output voltage of said level shift circuit when said first switch is closed; and
   a second circuit having a second switch which is opened and closed in a complementary operation mode to said first switch in accordance with said oscillator signal, and a second capacitor which is charged up by being supplied with a charged voltage of said first circuit when said second switch is closed.

7. A DC—DC converter circuit as claimed in claim 6, wherein said operation control signal for said main switching device is used as said oscillator signal.

8. A DC—DC converter circuit as claimed in claim 4, wherein said floating power supply generated by said power supply generating circuit or said second power supply generating circuit is used as a power supply for a circuit that generates said operation control signal.

9. A DC—DC converter circuit as claimed in claim 4, wherein each of said power supply generating circuit and said second power supply generating circuit comprises:
   a first circuit having a first switch which is opened and closed in accordance with a prescribed oscillator signal, and a first capacitor which is charged up by being supplied with said input voltage and the output voltage of said level shift circuit when said first switch is closed; and
   a second circuit having a second switch which is opened and closed in a complementary operation mode to said first switch in accordance with said oscillator signal, and a second capacitor which is charged up by being supplied with a charged voltage of said first circuit when said second switch is closed.

10. A DC—DC converter circuit as claimed in claim 9, wherein said operation control signal for said main switching device is used as said oscillator signal.

11. A DC—DC converter circuit as claimed in claim 1 or 2, wherein said level shift circuit has a configuration capable of generating a prescribed plurality of voltages, each lower than said input voltage, and generates one of said plurality of voltages in accordance with an externally issued instruction.

12. A DC—DC converter circuit for performing DC—DC conversion by switching an input voltage on and off in accordance with an operation control signal using an N-channel MOSFET whose drain is connected to said input voltage and whose source is connected to a load, comprising:

a level shift circuit which generates a voltage that is lower than said input voltage by a predetermined voltage;

a power supply generating circuit which generates a floating power supply by repeating a process consisting of first charging an input side capacitor in accordance with said input voltage and the output voltage of said level shift circuit and then transferring the charge of said input side capacitor to an output side capacitor;

a driving capacitor which is provided between said power supply generating circuit and the source of said N-channel MOSFET, and which is charged up by said floating power supply generated by said power supply generating circuit; and a driver circuit which, in accordance with said operation control signal, supplies a source voltage of said N-channel MOSFET plus a charged voltage of said driving capacitor to a gate of said N-channel MOSFET.

13. A DC—DC converter circuit for performing DC—DC conversion by switching an input voltage on and off in accordance with an operation control signal using an N-channel MOSFET whose drain is connected to said input voltage and whose source is connected to a load, comprising:

a level shift circuit which generates a voltage that is lower than said input voltage by a predetermined voltage;

a power supply generating circuit which generates a floating power supply by repeating a process consisting of first charging an input side capacitor in accordance with said input voltage and the output voltage of said level shift circuit and then transferring the charge of said input side capacitor to an output side capacitor; and a driver circuit which, in accordance with said operation control signal, supplies a charged voltage of said output side capacitor in said power supply generating circuit to a gate of said N-channel MOSFET.

* * * * *